United States Patent [19]

Bolger et al.

[11] 3,901,744

[45] Aug. 26, 1975

[54] METHOD OF MAKING SEMICONDUCTOR DEVICES

[75] Inventors: Derek E. Bolger; Martin Pion, both of Harlow, England

[73] Assignee: International Standard Electric Corporation, New York, N.Y.

[22] Filed: Jan. 24, 1974

[21] Appl. No.: 436,300

[30] Foreign Application Priority Data

Feb. 6, 1973 United Kingdom................ 5779/73

[52] U.S. Cl. ................ 148/171; 148/172; 148/173; 357/30

[51] Int. Cl.$^{2}$............................................ H01L 7/38

[58] Field of Search ............................ 148/171–173; 357/30

[56] References Cited

UNITED STATES PATENTS

| | | | |
|---|---|---|---|
| 3,478,213 | 11/1969 | Simon et al. | 357/30 |
| 3,647,578 | 3/1972 | Barnett et al. | 148/171 |
| 3,715,245 | 2/1973 | Barnett et al. | 148/171 |
| 3,823,043 | 7/1974 | Andre et al. | 148/171 |
| 3,825,449 | 7/1974 | Marinelli et al. | 148/172 |

*Primary Examiner*—G. Ozaki
*Attorney, Agent, or Firm*—John T. O'Halloran; Menotti J. Lombardi, Jr.; Edward Goldberg

[57] ABSTRACT

A method of making a semiconductor device avoids the problems of excessive liquid phase epitaxial growth at the edges of a slice which can interfere with processing in a sliding boat technique. A layer of refractory masking material is deposited on the front and back surfaces of the substrate slice. The central area of the front surface is then etched to leave the protective layer on the sides, edges and back. This prevents the undesired growth at the sides during the subsequent steps of growing semiconductor layers on the substrate. The slice is placed in a recess in a graphite boat having a sliding portion containing melts which contact the slice to grow first and second semiconductor layers. The central area of the back masking layer and substrate are then etched away to expose the first layer.

8 Claims, 6 Drawing Figures

METHOD OF MAKING SEMICONDUCTOR DEVICES

BACKGROUND OF THE INVENTION

1. Field of the Invention

This invention relates to the manufacture of semiconductor devices and is concerned with a method for eliminating fouling which is liable to occur in liquid phase epitaxial growth when such growth is permitted to extend right to the edges of a semiconductor slice.

2. Description of the Prior Art

In a related copending application Ser. No. 438,139 filed Jan. 30, 1974 and assigned to the same assignee as the instant application, there is described a method of applying a protective coating around the sides and edges of a semiconductor layered device so that only a central area can be etched while leaving a supporting rim. A somewhat similar masking technique can be used to prevent undesired growth in a liquid phase epitaxial process.

SUMMARY OF THE INVENTION

It is therefore the primary object of the present invention to provide an improved method for eliminating excessive liquid phase epitaxial growth at the edges of a semiconductor slice.

According to the present invention, this is accomplished providing the slice with a layer of refractory masking material covering the side and side edges of the slice and at least the peripheral region of each of the two faces of the slice so that, during a subsequent step of depositing by liquid phase epitaxy semiconductive material upon one face of the slice, epitaxial growth at the side and side edges of the slice is prevented by the masking material.

There follows a description of a method of manufacture of a transmission type GaAs photocathode embodying the invention in a preferred form as illustrated in the accompanying drawings.

DESCRIPTION OF THE PREFERRED EMBODIMENTS

Figure 1:
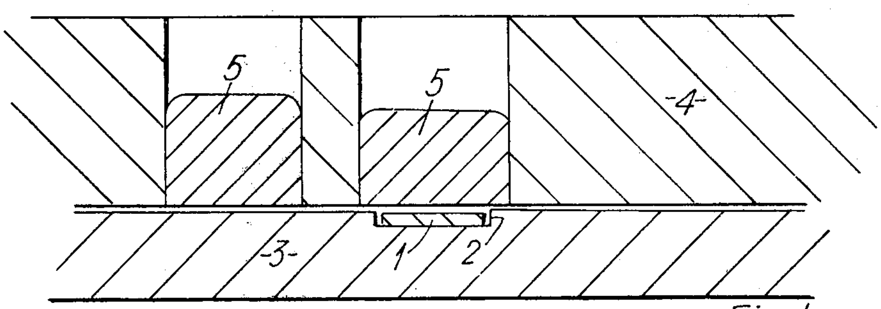
FIG. 1 depicts the sliding boat apparatus used for the liquid phase epitaxy.

A transmission type GaAs photocathode is made by a method which involves liquid phase epitaxial growth firstly of a layer of gallium aluminum arsenide upon a gallium arsenide substrate and then of a layer of GaAs upon the GaAlAs layer. A known sliding boat technique is used for this purpose. This involves placing the GaAs substrate, in the form of a slice 1, typically 1 to 5 $cm^2$ in area and 200 to 250 $\mu$ thick, face upwards in a shallow recess 2 formed in a graphite boat 3. The boat 3 is held in sliding contact with a slider 4 containing melts 5 in wells arranged so that by sliding movement the slice can be brought into contact with each of the melts in turn.

Clearances are kept to a minimum so as to minimize melt intermixing and carry-over. Typically the clearance between the boat and the slider is kept to not more than 50 $\mu$. Normally one would wish to arrange for the depth of the recess to cause the clearance between the slice and the slider to be initially greater by an amount equal to the total required thickness of epitaxial growth, typically 100 microns. However, when growing a layer 100 microns thick over the whole surface of a slice right up to its side edges, it is found that preferential growth is liable to occur in the neighborhood of these edges giving rise to a problem of fouling when an attempt is made to move the boat so as to remove the slice from contact with the melt.

Figure 2A:
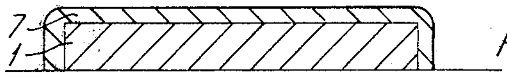
FIGS. 2*a* to 2*e* depict successive stages in the manufacture of a transmission type GaAs photocathode.
Figure 2B:
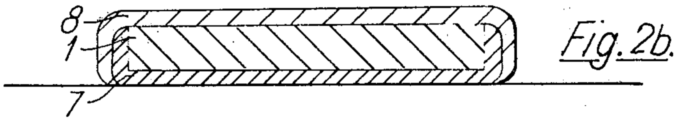

To overcome this problem of fouling, the side and side edges of the slice are first provided with a thin passivation layer. To this end a layer 7 of pyrolytic silica 0.2 to 0.4 $\mu$ thick is deposited upon the front surface and side of the slice 1 (FIG. 2*a*) and then the slice is turned over and a similar layer 8 is deposited upon the back surface and side of the slice 1 (FIG. 2*b*). The slice is turned over once again to expose the front surface. The periphery is masked with wax, and then dilute hydrofluoric acid is used to etch a window through the central region of the silica layer 7. In this way the slice is left with a silica passivation layer which covers its back surface, its side and side edges, and a narrow frame, typically 1 to 2 mm in width, round the periphery of its front surface as shown in FIG. 2*c*.

when depositing a GaAlAs layer by liquid epitaxy, the silica passivation layer is subject to a certain amount of attack by the aluminum in the melt. The severity of this attack depends upon the growth conditions. Frequently these conditions are such that the attack can be tolerated and no special measures taken to prevent it. It can however be prevented by the use of silicon nitride. Either layers of silicon nitride can be deposited in place of the layers 7 and 8 of silica, or, if the silicon nitride is found not to adhere sufficiently well to the slice, silicon nitride layers can be deposited on top of the layers 7 and 8 of silica. The silicon nitride layers may be deposited by glow discharge.

Figure 2C:
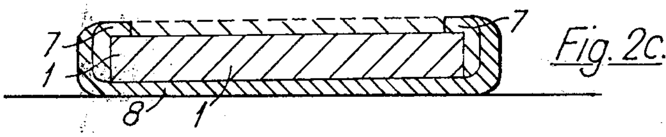
Figure 2D:
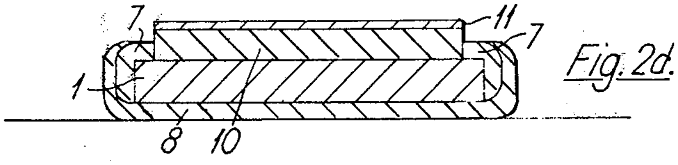

After the window has been etched through the passivation layer or layers on the front surface of the slice as shown in FIG. 2*c*, it is ready to be placed face upwards in the recess 2 of the boat 3 preparatory for growth of the epitaxial layers. The first layer to be grown is a p-type $Ga_{0.5}Al_{0.5}As$ layer 10 typically 40 to 100 $\mu$ thick, and this is followed by the growth of a p+-type GaAs layer 11 typically 5 to 10 $\mu$ thick as shown in FIG. 2*d*.

Figure 2E:
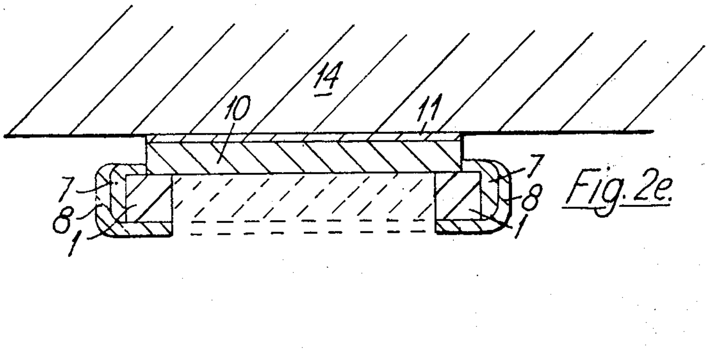

The slice with its epitaxially grown layers 10 and 11 face down is waxed down onto a support 14, shown inverted in FIG. 2*e*, the periphery of the slice is masked with wax and then dilute hydrofluoric acid is used to etch a window through the silica layer 8 to expose the back surface of the slice 1.

The central region of substrate material of the slice 1 is next removed chemically by a bubble etching technique which permits uniform removal of material over a large area. The slice still secured to its support 14 is placed with its exposed back surface face downwards in a suitable etch contained in a vessel with a porous base through which is pumped nitrogen gas. The exposure of the GaAlAs layer 10 can be seen by inspection of the substrate as it is slightly different in color, and hence it is not necessary to use a GaAs only selective etch. A suitable non-selective etch is a mixture of sulphuric acid and hydrogen peroxide.

Conventional bonding techniques are used for making electrical contact with these devices, such contact being made either directly to the grown layer 11 or to the rim of the supporting substrate 1. The exposed surface of the GaAs layer 11 may be subjected to conventional caesiating treatment used to improve efficiency by lowering the work function.

It is to be understood that the foregoing description of specific examples of this invention is made by way of example only and is not to be considered as a limitation on its scope.

What is claimed is:

1. A method of manufacture of a semiconductor device from a slice of semiconductive material including the step of coating the slice with a layer of refractory masking material covering the two opposite faces and the sides of the slice, the step of etching away a central region of said refractory masking material on one of said faces to expose said central region of said one face and leave a peripheral region, the step of depositing first and second semiconductor layers in said exposed central region of said one face by liquid phase epitaxy, epitaxial growth at the sides and peripheral edges of the slice being prevented by the masking material, and the step of etching away central regions of said refractory masking material on the other said face and of said slice to expose said first semiconductor layer.

2. The method of claim 1 wherein one face of said slice is coated with a first layer of said refractory masking material and the opposite face is coated with a second layer of said refractory masking material to overlap a peripheral portion of said first layer of masking material.

3. The method as claimed in claim 1 wherein said step of depositing layers includes growing a first layer of one semiconductor material in said central region of said one face followed by a second layer of another semiconductor material upon the first semiconductor layer.

4. The method as claimed in claim 3 wherein the material of the slice is GaAs.

5. The method as claimed in claim 4 wherein said first semiconductor layer is of gallium aluminum arsenide and said second semiconductor layer is of gallium arsenide.

6. The method as claimed in claim 3 wherein the layer of refractory masking material is silica.

7. The method as claimed in claim 3 wherein the layer of refractory material is silicon nitride.

8. The method as claimed in claim 3 wherein the layer of refractory material is silica and including a second refractory layer of silicon nitride.

* * * * *